US011807925B2

(12) United States Patent
Fuse et al.

(10) Patent No.: US 11,807,925 B2
(45) Date of Patent: Nov. 7, 2023

(54) PROBE PIN MATERIAL INCLUDING AG—PD—CU-BASED ALLOY

(71) Applicant: TANAKA KIKINZOKU KOGYO K.K., Tokyo (JP)

(72) Inventors: Takeshi Fuse, Isehara (JP); Kunihiro Shima, Isehara (JP); Takeyuki Sagae, Isehara (JP); Shinji Kouno, Isehara (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 17/982,092

(22) Filed: Nov. 7, 2022

(65) Prior Publication Data

US 2023/0250513 A1    Aug. 10, 2023

(30) Foreign Application Priority Data

Feb. 10, 2022 (JP) ................. 2022-019142

(51) Int. Cl.
| | |
|---|---|
| *C22C 5/04* | (2006.01) |
| *C22C 30/02* | (2006.01) |
| *C22F 1/14* | (2006.01) |
| *C22C 30/06* | (2006.01) |
| *C22C 30/04* | (2006.01) |

(52) U.S. Cl.
CPC ............. *C22C 5/04* (2013.01); *C22C 30/02* (2013.01); *C22C 30/04* (2013.01); *C22C 30/06* (2013.01); *C22F 1/14* (2013.01)

(58) Field of Classification Search
CPC ........... C22C 5/04; C22C 30/04; C22C 30/02; C22C 30/06; C22F 1/14
See application file for complete search history.

(56) References Cited

U.S. PATENT DOCUMENTS

| | | | |
|---|---|---|---|
| 5,484,569 | A | 1/1996 | Klein et al. |
| 5,833,774 | A | 11/1998 | Klein et al. |
| 10,053,751 | B2 | 8/2018 | Aruga |
| 10,137,534 | B2 | 11/2018 | Yamada et al. |
| 2006/0197542 | A1 | 9/2006 | Tanaka |
| 2010/0176833 | A1 | 7/2010 | Morita et al. |
| 2013/0292008 | A1 | 11/2013 | Shishino et al. |
| 2015/0168455 | A1 | 6/2015 | Anraku et al. |
| 2015/0197834 | A1 | 7/2015 | Kumita et al. |
| 2021/0017627 | A1 | 1/2021 | Shishino |
| 2021/0310103 | A1 | 10/2021 | Takahashi et al. |
| 2022/0064761 | A1 | 3/2022 | Fecher et al. |

FOREIGN PATENT DOCUMENTS

| | | |
|---|---|---|
| CN | 101925680 B | 12/2010 |
| JP | H10-504062 A | 4/1998 |
| JP | 4176133 B1 | 11/2008 |
| JP | 4216823 B2 | 1/2009 |
| JP | 2017-025354 A | 2/2017 |
| JP | 2022-041921 A | 3/2022 |
| TW | 201708553 A | 3/2017 |
| WO | WO-2012/077378 A1 | 6/2012 |
| WO | WO-2014/021465 A1 | 2/2014 |
| WO | WO-2017/132504 A1 | 8/2017 |
| WO | WO-2019/130511 A1 | 7/2019 |
| WO | WO-2019/194322 A1 | 10/2019 |

OTHER PUBLICATIONS

English Machine Translation of WO 2019/194322 (Oct. 10, 2019).*
Japanese Patent Office, "Decision to Grant a Patent," issued in connection with Japanese Patent Application No. 2022-019142, dated Apr. 18, 2022.
Taiwan Office Action issued in connection with TW Appl. Ser. No. 111140844 dated Apr. 19, 2023.
Extended European Search Report issued in corresponding European Patent Application No. 22206080.8, dated Jun. 9, 2023.

* cited by examiner

*Primary Examiner* — Jessee R Roe
(74) *Attorney, Agent, or Firm* — Foley & Lardner LLP

(57) ABSTRACT

A probe pin material including a Ag—Pd—Cu-based alloy essentially including Ag, Pd and Cu, B as a first additive element, and at least any element of Zn, Bi and Sn, as a second additive element. A concentration of the first additive element is 0.1 mass % or more and 1.5 mass % or less, and a concentration of the second additive element is 0.1 mass % or more and 1.0 mass % or less. A Ag concentration, a Pd concentration and a Cu concentration in the Ag—Pd—Cu-based alloy are required as follows: a Ag concentration ($S_{Ag}$), a Pd concentration ($S_{Pd}$) and a Cu concentration ($S_{Cu}$) converted as given that a Ag—Pd—Cu ternary alloy is formed from only such three elements all fall within a predetermined range in a Ag—Pd—Cu ternary system phase diagram. The probe pin material is excellent in resistance value and hardness/wear resistance, and also is enhanced in bending resistance.

19 Claims, 6 Drawing Sheets

NUMBERS IN THE DIAGRAM CORRESPOND TO NUMBERS REPRESENTING RESPECTIVE EXAMPLES IN TABLE 1.
HEREIN, "5" IN THE DIAGRAM CORRESPONDS TO "EXAMPLES 5 TO 16 AND COMPARATIVE EXAMPLES 5 TO 8" AND "12" IN THE DIAGRAM CORRESPONDS TO "EXAMPLES 23 TO 24 AND COMPARATIVE EXAMPLES 9 TO 12".

NUMBERS IN THE DIAGRAM CORRESPOND TO
NUMBERS REPRESENTING COMPARATIVE EXAMPLES
1 TO 4 IN TABLE 1.

PROBE PIN MATERIAL INCLUDING AG—PD—CU-BASED ALLOY

CROSS-REFERENCE TO RELATED APPLICATION

This application claims priority to Japanese Application No. 2022-019142, filed on Feb. 10, 2022. The content of this application is hereby incorporated by reference in its entirety.

BACKGROUND OF THE INVENTION

Field of the Invention

The present invention relates to an alloy material suitable for a probe pin for use in inspections of electric/electronic equipment, a semiconductor device, and the like. Specifically, the present invention relates to a probe pin material which includes a Ag—Pd—Cu-based alloy, in which the composition of each constituent element and additive element selection are suitable, and which is not only low in resistance, but also excellent in wear resistance and furthermore also excellent in bending workability.

Description of the Related Art

Probe inspection apparatuses provided with probe cards are used in continuity inspections/operation characteristic inspections of components and the like mounted on substrates of various types of electronic equipment and/or semiconductor wafers of semiconductor devices. A large number of probe pins are supported on probe cards and inspections are performed by contacting such probe pins with electrodes of components and the like and then sending and receiving electric signals to and from such electrodes.

Probe pins are used under a harsh environment where conducting is made with contact/separation of such probe pins with/from electrodes being infinitely repeated. Thus, probe pin materials are demanded to have not only low electric resistance of conductive materials, but also mechanical properties such as wear resistance/hardness, corrosion resistance/oxidation resistance, and the like.

There are several types of probe pin forms, and a linear vertical type probe pin, a cantilever type probe pin, and a pogo pin (spring-attached pin) type probe pin are well known. In particular, a cantilever type probe pin, which has one side bent and worked at an angle of 60° to 90°, is used in this state with being repeatedly contacted with/separated from an inspection object. Such a cantilever type probe pin, when used, bears a large load at a moiety bent and worked, and fatigue fracture is sometimes caused. A pogo pin type probe pin also has a tip worked into a complicated geometry, and may be fractured/partially lost under a high contact pressure. Thus, bending resistance is also an important characteristic for a material applied to these probe pins.

Some alloy metals have been heretofore proposed as probe pin materials in consideration of various demand characteristics described above. For example, a precious metal base alloy mainly containing a precious metal such as Pt, Ir, or Au has been proposed as a probe pin material. Such a precious metal alloy is particularly excellent in wear resistance, and is known as a probe pin material having high hardness due to plastic working and a precipitation effect (Patent Documents 1 and 2).

Many application examples of Ag—Pd—Cu alloys to probe pin materials are known. Ag—Pd—Cu alloys are relatively-low-resistance alloys, and furthermore can also be expected to be increased in hardness with PdCu phases formed due to age-precipitation. Ag—Pd—Cu alloys, to which various additive elements are added, can thus achieve enhancements in characteristics such as oxidation resistance and workability. Examples of a probe pin material including such a Ag—Pd—Cu-based alloy include one which is improved in electric properties with oxidation resistance/discoloration resistance being ensured due to addition of Ni, Zn, and B as additive elements (Patent Document 3). Examples also include a Ag—Pd—Cu alloy which exhibits the balance among specific resistance, hardness, and workability at a higher level than conventional one, due to addition of In as an additive element (Patent Document 4). Examples further include a Ag—Pd—Cu—Pt alloy due to addition of Pt, having bending resistance (Patent Document 5).

Prior Art Document

Patent Document

Patent Document 1: Japanese Patent No. 4176133
Patent Document 2: Japanese Patent No. 4216823
Patent Document 3: Japanese Translation of PCT International Application Publication No. 10-504062
Patent Document 4: International Publication No. WO 2019/194322
Patent Document 5: International Publication No. WO 2012/077378

SUMMARY OF THE INVENTION

Technical Problem

A majority of conventional probe pin materials has been improved with an emphasis on some of demand characteristics, and a minority of such probe pin materials has been improved in the whole of demand characteristics in a well-balanced manner. The precious metal base alloys in Patent Documents 1 and 2, although are extremely favorable in hardness/wear resistance, are higher in resistance value due to characteristics of constituent metals.

In this regard, Ag—Pd—Cu-based alloys are lower in resistance than the precious metal base alloys in Patent Documents 1 and 2, and can achieve enhancements in a plurality of characteristics such as corrosion resistance due to additive element selection. However, if bending resistance and the like are considered, even conventional Ag—Pd—Cu-based alloys are insufficient from the viewpoint of overall enhancements in characteristics. With reference to the above conventional techniques, the Ag—Pd—Cu—Ni—Zn—B alloy in Patent Document 3 not only is liable to be slightly higher in electric resistance, but also is not clear about the improvement effect of bending resistance. The Ag—Pd—Cu—In alloy in Patent Document 4 is deteriorated in ductibility of the alloy due to In and then deteriorated in bending resistance. The Ag—Pd—Cu—Pt alloy in consideration of bending resistance in Patent Document 4, although fatigue fracture of a portion bent can be suppressed, is so low in hardness and thus is inferior in basic characteristics when serves as a probe pin material.

Probe pin materials including Ag—Pd—Cu-based alloys will be hereafter demanded to stably exhibit a lower resistance value. Power devices (SiC, GaN, and the like) mounted on electric cars such as HV/EV generally spread have been recently predicated to be operated at high temperatures, and thus the inspection environment of such devices has also been set in a high-temperature range of 100° C. to 250° C. Ag—Pd—Cu-based alloys, while have oxidation resistance and the like in the temperature range, are changed in characteristics when are at more than 300° C. being a higher temperature than the range. The reason for this is because Ag—Pd—Cu-based alloys are age-hardenable alloys as described above and are progressed in aging at 300° C. or more. Probe pins are conducted in a device inspection process and thus can be under a higher temperature than the atmosphere temperature due to resistance heat. A more reduction in resistance value than conventional one and thus suppression of heating are necessary for no changes in characteristics of probe pin materials.

The present invention has been made in view of the above circumstances, and provides a probe pin material which not only is excellent in characteristics demanded for conventional probe pin materials, such as resistance value and hardness (wear resistance), but also is enhanced in bending resistance.

Solution to Problem

The present inventors have decided to develop a material based on a Ag—Pd—Cu-based alloy, in specific studies of the present invention. The reason for this is that a Ag—Pd—Cu-based alloy is essentially a low-resistance alloy and is considered to be able to serve as a material lower in resistance than conventional one by optimization of the composition. A reduction in resistance of an alloy is a preferential characteristic of a conductive member as a probe pin. Additionally, although a Ag—Pd—Cu-based alloy being an age-hardenable alloy is concerned about changes in characteristics at a higher temperature than 300° C. as described above, it is deemed that such a problem can also be handled with a reduction in resistance.

The present inventors have found, as a Ag—Pd—Cu-based alloy which can deal with the above problems, a Ag—Pd—Cu-based alloy in which the composition of a Ag—Pd—Cu ternary alloy formed of only three elements of base Ag, Pd and Cu is optimized and to which additive elements capable of imparting wear resistance and bending resistance to the Ag—Pd—Cu ternary alloy optimized are added in suitable ranges, and thus have conceived the present invention.

The present invention solving the above problems is drawn to a probe pin material formed of a Ag—Pd—Cu-based alloy including Ag, Pd and Cu, B as a first additive element, at least any element of Zn, Bi and Sn, as a second additive element, and unavoidable impurities, in which when based on the total value of a Ag concentration, a Pd concentration and a Cu concentration in the Ag—Pd—Cu-based alloy, the Ag concentration, the Pd concentration and the Cu concentration are respectively converted into a Ag concentration $S_{Ag}$, a Pd concentration $S_{Pd}$ and a Cu concentration $S_{Cu}$ in a Ag—Pd—Cu ternary alloy, all the $S_{Ag}$, the $S_{Pd}$ and the $S_{Cu}$ fall within a range of a polygon (A1-A2-A3-A4) surrounded with straight lines connecting respective points of a point A1 (Ag: 5.5 mass %, Pd:47.5 mass %, Cu:47 mass %), a point A2 (Ag: 5.5 mass %, Pd:58.5 mass %, Cu:36 mass %), a point A3 (Ag: 18 mass %, Pd:49 mass %, Cu:33 mass %) and a point A4 (Ag: 18 mass %, Pd:45 mass %, Cu:37 mass %) in a Ag—Pd—Cu ternary system phase diagram, a concentration of the first additive element is 0.1 mass % or more and 1.5 mass % or less, and a concentration of the second additive element is 0.1 mass % or more and 1.0 mass % or less. Hereinafter, the constitution and various characteristics of the probe pin material of the present invention will be described in detail. In the present specification, the alloy formed of only three elements of Ag, Pd and Cu is referred to as a "Ag—Pd—Cu ternary alloy". The alloy including Ag, Pd and Cu, and one or more elements other than such metals is referred to as a "Ag—Pd—Cu-based alloy".

I. Constitution of the probe pin material of the present invention

As described above, the probe pin material of the present invention includes a Ag—Pd—Cu-based alloy. The Ag—Pd—Cu-based alloy is a quintuple or higher Ag—Pd—Cu-based alloy formed by addition of B as a first additive element and at least any element of Zn, Bi and Sn, as a second additive element, to a Ag—Pd—Cu ternary alloy. Hereinafter, the actions and the composition ranges of such essential constituent elements will be described.

(i) Ag, Pd and Cu

A requirement of the Ag—Pd—Cu-based alloy applied in the present invention is that concentration values ($S_{Ag}$, $S_{Pd}$ and $S_{Cu}$) on conversion of the Ag concentration, the Pd concentration and the Cu concentration in the alloy into the Ag concentration, the Pd concentration and the Cu concentration in a Ag—Pd—Cu ternary alloy fall within a predetermined region (A1-A2-A3-A4) described below of a phase diagram of the Ag—Pd—Cu ternary alloy.

The reason for such conversion of the Ag concentration, the Pd concentration and the Cu concentration in the Ag—Pd—Cu-based alloy of the present invention into the Ag concentration, the Pd concentration and the Cu concentration in the Ag—Pd—Cu ternary alloy is because the history of alloy development in the present invention is emphasized. In other words, the present invention first reveals a composition range so that the Ag—Pd—Cu ternary alloy by itself can be optimal as a probe pin material. The Ag—Pd—Cu ternary alloy optimized has a composition in a predetermined region in which a low-Ag and high-Pd alloy reduced in Ag concentration and increased in Pd concentration as compared with the above conventional techniques is provided. The Ag—Pd—Cu ternary alloy has a composition range which, while a main object is a reduction in resistance, can allow wear resistance and bending resistance to be exhibited as much as possible even in the ternary alloy. The present invention is to achieve optimization of the types and concentrations of the additive elements, provided that the Ag—Pd—Cu ternary alloy is optimized.

In consideration of such an alloy design process, it is reasonable to assume that the alloy composition in no actions of the first additive element and the second additive element (namely, no addition of the respective additive elements) in the Ag—Pd—Cu-based alloy of the present invention corresponds to the composition of the Ag—Pd—Cu ternary alloy optimized. For this reason, the present inventors have specified the Ag concentration, the Pd concentration and the Cu concentration in the Ag—Pd—Cu-based alloy of the present invention as follows.

"The Ag concentration, the Pd concentration and the Cu concentration in the Ag—Pd—Cu-based alloy are converted into the Ag concentration ($S_{Ag}$), the Pd concentration ($S_{Pd}$) and the Cu concentration ($S_{Cu}$) in the Ag—Pd—Cu ternary alloy" means that "when Ag, Pd and Cu constituting the Ag—Pd—Cu-based alloy of the present invention are assumed to form a Ag—Pd—Cu ternary alloy without any change in concentration ratio among the respective elements, the Ag concentration, the Pd concentration and the Cu concentration in the Ag—Pd—Cu ternary alloy are converted into $S_{Ag}$, $S_{Pd}$ and $S_{Cu}$". In a specific procedure of this conversion, first, the total value of the Ag concentration, the Pd concentration and the Cu concentration in the Ag—Pd—Cu-based alloy of the present invention is determined. The total value is less than 100 mass % due to the presence of the first and second additive elements. The ratio between the total value and the total concentration (100 mass %) of Ag, Pd and Cu in the Ag—Pd—Cu ternary alloy in the assumption, (100/(the total value of the Ag concentration, the Pd concentration and the Cu concentration in the Ag—Pd—Cu-based alloy of the present invention)), is defined as a coefficient K for the conversion. The coefficient K can be multiplied with the Ag concentration, the Pd concentration and the Cu concentration in the Ag—Pd—Cu-based alloy of the present invention to thereby respectively provide $S_{Ag}$, $S_{Pd}$ and $S_{Cu}$.

The above requirement about the Ag concentration, the Pd concentration and the Cu concentration may be herein often such that the concentration values themselves before the conversion fall within a predetermined region (A1-A2-A3-A4) in a phase diagram of the Ag—Pd—Cu ternary alloy, and it is deemed that the concentration values preferably fall within such a predetermined region. Accordingly, the above requirement may also be determined based on the Ag concentration, the Pd concentration and the Cu concentration in the Ag—Pd—Cu-based alloy without the conversion. In the present specification, the description is made along with the determination procedures/requirements specified in the present application.

The Ag concentration, the Pd concentration and the Cu concentration in the Ag—Pd—Cu-based alloy constituting the probe pin material of the present invention are set such that the $S_{Ag}$, the $S_{Pd}$ and the $S_{Cu}$ are located within a range of a polygon (A1-A2-A3-A4) surrounded with straight lines connecting respective points of a point A1 (Ag: 5.5 mass %, Pd:47.5 mass %, Cu:47 mass %), a point A2 (Ag: 5.5 mass %, Pd:58.5 mass %, Cu:36 mass %), a point A3 (Ag: 18 mass %, Pd:49 mass %, Cu:33 mass %) and a point A4 (Ag: 18 mass %, Pd:45 mass %, Cu:37 mass %) in a Ag—Pd—Cu ternary system phase diagram. FIG. 1 illustrates a polygon (A1-A2-A3-A4) in a Ag—Pd—Cu ternary system phase diagram for specifying the concentration ranges within which the $S_{Ag}$, the $S_{Pd}$ and the $S_{Cu}$ are required to fall.

The ranges of the $S_{Ag}$, the $S_{Pd}$ and the $S_{Cu}$ as the conversion values of the Ag concentration, the Pd concentration and the Cu concentration in the Ag—Pd—Cu-based alloy of the present invention are specified as described above mainly in order to achieve a reduction in resistance of the Ag—Pd—Cu-based alloy. In other words, the Ag—Pd—Cu-based alloy, in which at least any of the $S_{Ag}$, the $S_{Pd}$ and the $S_{Cu}$ is located outside lines (A1-A2, A2-A3, A3-A4, A4-A1) mutually connecting respective points (A1, A2, A3, A4) in FIG. 1, is liable to be higher in specific resistance after an aging heat treatment. The ranges of the $S_{Ag}$, the $S_{Pd}$ and the $S_{Cu}$ in the present invention can also have an effect on wear resistance (hardness) and bending resistance of the Ag—Pd—Cu-based alloy. In particular, the Ag—Pd—Cu-based alloy, in which at least any of the $S_{Ag}$, the $S_{Pd}$ and the $S_{Cu}$ is located outside the line A2-A3 in FIG. 1, is liable to be lower in hardness. The Ag—Pd—Cu-based alloy, in which at least any of the $S_{Ag}$, the $S_{Pd}$ and the $S_{Cu}$ is located outside the line A3-A4, is liable to be inferior in bending resistance.

A case of "falling within a range of a polygon (A1-A2-A3-A4) surrounded with straight lines connecting respective points" in the present invention encompasses a case where the $S_{Ag}$, the $S_{Pd}$ and the $S_{Cu}$ are located on any side or vertex of the polygon.

The $S_{Ag}$, the $S_{Pd}$ and the $S_{Cu}$ as the conversion values of the Ag concentration, the Pd concentration and the Cu concentration in the Ag—Pd—Cu-based alloy of the present invention are preferably located in a range of a polygon (A1-A2-B3-B4) surrounded with straight lines connecting respective points of the point A1, the point A2, a point B3 (Ag: 13 mass %, Pd:52.8 mass %, Cu:34.2 mass %) and a point B4 (Ag: 13 mass %, Pd:46 mass %, Cu:41 mass %). FIG. 2 illustrates the polygon (A1-A2-B3-B4) specifying preferable concentration ranges of the respective elements of Ag, Pd and Cu. Such a composition range means that the alloy has a limited composition range as compared with the composition in FIG. 1, and corresponds to an alloy composition which enables more suitable specific resistance and bending resistance to be exhibited.

The $S_{Ag}$, the $S_{Pd}$ and the $S_{Cu}$ in the Ag—Pd—Cu-based alloy of the present invention are particularly preferably located within a range of a polygon (C1-A2-C3-C4) surrounded with straight lines connecting respective points of a point C1 (Ag: 5.5 mass %, Pd:52 mass %, Cu:42.5 mass %), the point A2, a point C3 (Ag: 11 mass %, Pd:54.3 mass %, Cu:34.7 mass %) and a point C4 (Ag: 11 mass %, Pd:50 mass %, Cu:39 mass %). FIG. 3 illustrates the polygon (C1-A2-C3-C4) specifying particularly preferable concentration ranges of the respective elements of Ag, Pd and Cu. The Ag—Pd—Cu-based alloy, in which the Ag concentration, the Pd concentration and the Cu concentration are such that the $S_{Ag}$, the $S_{Pd}$ and the $S_{Cu}$ are thus located within a most limited range, can exhibit particularly suitable specific resistance, bending resistance, and the like.

(ii) First additive element (B)

B as the first additive element (boron) is an additive element which, when added in a proper amount, has an effect of increasing hardness (enhancing wear resistance) of the Ag—Pd—Cu-based alloy and additionally an effect of imparting ductibility to the alloy and enhancing bending resistance. The B concentration is 0.1 mass % or more and 1.5 mass % or less. A concentration of less than 0.1 mass % does not allow the above effects to be exerted, and a concentration of more than 1.5 mass % leads to deterioration in plastic workability and makes cold working difficult, and decreases the effect of enhancing hardness. Excessive addition of B can also cause deterioration in bending resistance. The B concentration is more preferably 0.15 mass % or more and 0.5 mass % or less.

(iii) Second additive element (Zn, Bi and Sn)

Zn (zinc), Bi (bismuth) and Sn (tin) each serving as the second additive element forms an intermetallic compound with a PdCu ordered phase as an age hardening factor of the Ag—Pd—Cu-based alloy. The grain boundary is strengthened with the intermetallic compound to result in an enhancement in wear resistance. At least one of Zn, Bi and Sn is required to be added, and only any one of the metals may be added. The total concentration of Zn, Bi and Sn included is 0.1 mass % or more and 1.0 mass % or less. A total concentration of less than 0.1 mass % does not allow the above effects to be exerted, and a total concentration of more than 1.0 mass % leads to deterioration in bending resistance. Zn, Bi and Sn excessively added can also cause deterioration in plastic workability and difficult cold working. The total concentration of Zn, Bi and Sn is more preferably 0.1 mass % or more and 0.5 mass % or less.

(iv) Unavoidable impurities

The probe pin material of the present invention is composed of substantially Ag, Pd and Cu, and the first and second additive elements (B, and at least any of Zn, Bi and Sn). Accordingly, the total of the concentrations of these essential constituent elements, namely, the total of the Ag concentration, the Pd concentration, the Cu concentration, the concentration of the first additive element and the concentration of the second additive element is 100 mass %. Herein, the probe pin material of the present invention may contain unavoidable impurities. Au, Co, Cr, Fe, Ir, Mg, Ni, Pt, Rh, Ru, Si, Ti, and/or the like can be contained as such unavoidable impurities. The total of such impurities is preferably 0.02 mass % or less, more preferably 0.005 mass % or less. If such unavoidable impurities are detected, the sum of the total value of the concentrations of the essential constituent elements and the concentration of such unavoidable impurities is 100 mass %.

The methods for measuring the concentrations of the respective constituent elements (the Ag concentration, the Pd concentration, the Cu concentration and the concentrations of the first/second additive elements) in the Ag—Pd—Cu-based alloy of the present invention do not need to be particularly limited, and inductively coupled emission spectroscopy (ICP emission spectroscopy), fluorescent X-ray analysis (XRF analysis) and/or the like can be applied. Furthermore, a simple measurement method such as energy dispersive X-ray analysis (EDX) or wavelength dispersive X-ray analysis (WDX) can also be applied.

II. Characteristics and usage mode of the probe pin material of the present invention As described above, the Ag—Pd—Cu-based alloy constituting the probe pin material of the present invention not only is low in resistance and has wear resistance, but also is excellent in bending resistance. The Ag—Pd—Cu-based alloy of the present invention preferably has a specific resistance at room temperature of 10 μΩ·cm or less, among electric characteristics. A further preferable specific resistance value at room temperature is 8 μΩ·cm or less. Standards of the specific resistance value, and hardness and bending resistance described below are standards with respect to an alloy subjected to an aging heat treatment in a production method described below.

The present inventive Ag—Pd—Cu-based alloy of preferably has a high hardness for ensuring wear resistance. Specifically, the Vickers hardness is preferably 380 Hv or more, further preferably 420 HV or more. The upper limit of the hardness should not be particularly limited, but any limit is provided in order to appropriately perform a working and heating treatment. An excessive increase in only hardness may result in deterioration in bending resistance. Furthermore, such an increase may also result in the occurrence of scratching on an inspection object because of a probe pin application. Thus, the hardness of the probe pin material of the present invention is preferably 580 Hv or less.

Furthermore, the Ag—Pd—Cu-based alloy of the present invention is excellent in bending resistance. The bending resistance can be evaluated with the number of times of repeated bending of a wire rod of the Ag—Pd—Cu-based alloy. Specifically, one end of the wire rod of the Ag—Pd—Cu-based alloy is secured, and then a first bending step of bending the wire rod at an angle of substantially 90° from the straight line state, and a second bending step of bending the wire rod so as to return the wire rod from a bent state to the straight line state are alternately repeated, where the first bending step and the second bending step are each defined as a single time of bending, and the number of times of bending until the wire rod is broken is counted. The bending resistance can be evaluated with the number of times of bending. Such breaking means a state where the wire rod is completely disconnected, and the number of times of bending at the state achieved is preferably counted. The Ag—Pd—Cu-based alloy of the present invention preferably exhibits a number of times of bending of 5 or more based on the evaluation method. The upper limit is not required to be particularly set, but is preferably 30 or less because the alloy of the present invention is also a metal material and thus cannot be bent unlimitedly.

The present invention is naturally applied to a probe pin, and is very often used on a form processed to a wire rod or rod material. The dimension of such a form is not particularly limited, and a wire rod having, as a line size, a diameter of 50 μm or more and 1000 μm or less is often utilized. The above resistance value and hardness are preferably exhibited when the wire rod is utilized. It is preferable also in evaluation of the bending resistance to satisfy the standard of such a line size range. A probe pin form including the Ag—Pd—Cu-based alloy of the present invention is excellent in bending resistance and thus is suitable for a cantilever type probe pin, but is not limited to such a probe pin. Any other form of a probe pin, such as a vertical form, can also be utilized.

III. Method for producing the probe pin material of the present invention

The probe pin material of the present invention can be produced by producing an alloy ingot of the Ag—Pd—Cu-based alloy having the above composition by a melt-casting method, and cold working the alloy ingot so as to allow the alloy ingot to have appropriate dimension/shape for a probe pin and then subjecting the alloy ingot to an aging heat treatment. The melt casting method here applied can be alloy ingot production due to casting after vacuum melting (melting under reduced pressure) or air melting (atmosphere melting), or due to a continuous casting method or arc melting.

In melt casting of the alloy ingot, such melt casting may be made with preparation of Ag, Pd and Cu at a composition (100% in total) falling within a range of A1-A2-A3-A4 in FIG. 1, and addition of the first additive element and the second additive element. The concentrations of the first additive element and the second additive element in the Ag—Pd—Cu-based alloy, and the $S_{Ag}$, the $S_{Pd}$ and the $S_{Cu}$ can also be set in advance and adopted for determination of the concentrations of Ag, Pd and Cu in the alloy ingot. In such a case, the coefficient K can be calculated from the concentrations set of the first additive element and the second additive element, and thus the concentrations of Ag, Pd and Cu in the alloy ingot can be determined from the $S_{Ag}$, the $S_{Pd}$ and the $S_{Cu}$ set and the reciprocal number (1/K) of the coefficient K.

The cold working step is a step of not only molding a Ag—Pd—Cu-based alloy ingot into a desired shape/dimension, but also introducing the working strain into the alloy, to thereby provide strength/hardness necessary for a probe pin. The cold working manner can be appropriately selected from rolling (including groove rolling), wire drawing, drawing/extruding, and the like, and such any working can be repeated multiple times or can be combined. The working temperature is preferably 100° C. or less.

The aging heat treatment serves as a step of heat-treating the Ag—Pd—Cu-based alloy worked as described above to thereby precipitate a PdCu ordered phase and provide desired hardness. The temperature of the aging heat treatment is preferably 300° C. or more and 580° C. or less. The treatment time is preferably 10 minutes or more and 4 hours or less.

The aging heat treatment is preferably performed in combination with a solution heat treatment. The solution heat treatment is a treatment for heat-treating the Ag—Pd—Cu-based alloy at a high temperature to thereby provide a uniform supersaturated solid solution, and is a treatment for suitably performing precipitation of a PdCu ordered phase with a subsequent aging treatment. The heating temperature of the solution heat treatment of the Ag—Pd—Cu-based alloy of the present invention is preferably 650° C. or more and 950° C. or less. Cooling after heating is preferably quenching such as water cooling.

A solution treatment can be performed multiple times. Wire drawing and/or the like can be performed multiple times in the cold working step, and the solution treatment can be performed with respect to such each cold working and the aging heat treatment can be performed after the last cold working, to thereby provide a Ag—Pd—Cu-based alloy having optimal characteristics. When a combination of the cold working and the solution treatment is performed multiple times, for example, the solution heat treatment can be performed with the rate of working (cross-sectional area reduction ratio) per cold working being controlled to 12% or more and 80% or less.

The Ag—Pd—Cu-based alloy subjected to the aging heat treatment has suitable hardness and electric characteristics and also has bending resistance. After the aging treatment, the alloy may be worked so as to have a shape necessary for a probe pin. The alloy may also be bent and worked into a cantilever type probe pin.

Advantageous Effects of the Invention

As described above, the probe pin material of the present invention basically includes a Ag—Pd—Cu-based alloy, and also has composition ranges of Ag, Pd and Cu, optimized based on a region surrounded with the point A1, the point A2, the point A3 and the point A4, and achieves a reduction in resistance. Appropriate additive elements are added to thereby impart wear resistance and bending resistance.

DETAILED DESCRIPTION OF THE PREFERRED EMBODIMENTS

Hereinafter, a suitable embodiment of the present invention is described. In the present embodiment, probe pin materials including Ag—Pd—Cu-based alloys having various compositions were produced, and the hardness and the specific resistance of each of the probe pin materials were measured and furthermore an evaluation test of bending resistance of such each probe pin material was performed.

In the present embodiment, a base material where bare metal raw materials of Ag, Pd and Cu were mixed was produced, bare metal raw materials of a first additive element (B) and second additive element(s) (Zn, Bi and Sn) were added to the base material, thereafter the resulting mixture was subjected to melt casting, and thus a Ag—Pd—Cu-based alloy ingot was produced. In the present embodiment, twelve types of base materials (used in Examples 1 to 34 and Comparative Examples 5 to 12) were produced where Ag, Pd and Cu were mixed at a ratio falling within a range of A1-A2-A3-A4 in FIG. 1. In addition, four types of base materials were produced (used in Comparative Examples 1 to 4) where Ag, Pd and Cu were mixed at a ratio outside a range of A1-A2-A3-A4 in FIG. 1. After each additive element was added, a Ag—Pd—Cu-based alloy ingot was produced by vacuum melting and continuous casting. Herein, a Ag—Pd—Cu ternary alloy or Ag—Pd—Cu-based alloy ingot where both the first and second additive elements or one of the additive elements were/was not added was also produced in Comparative Example.

Figure 4:
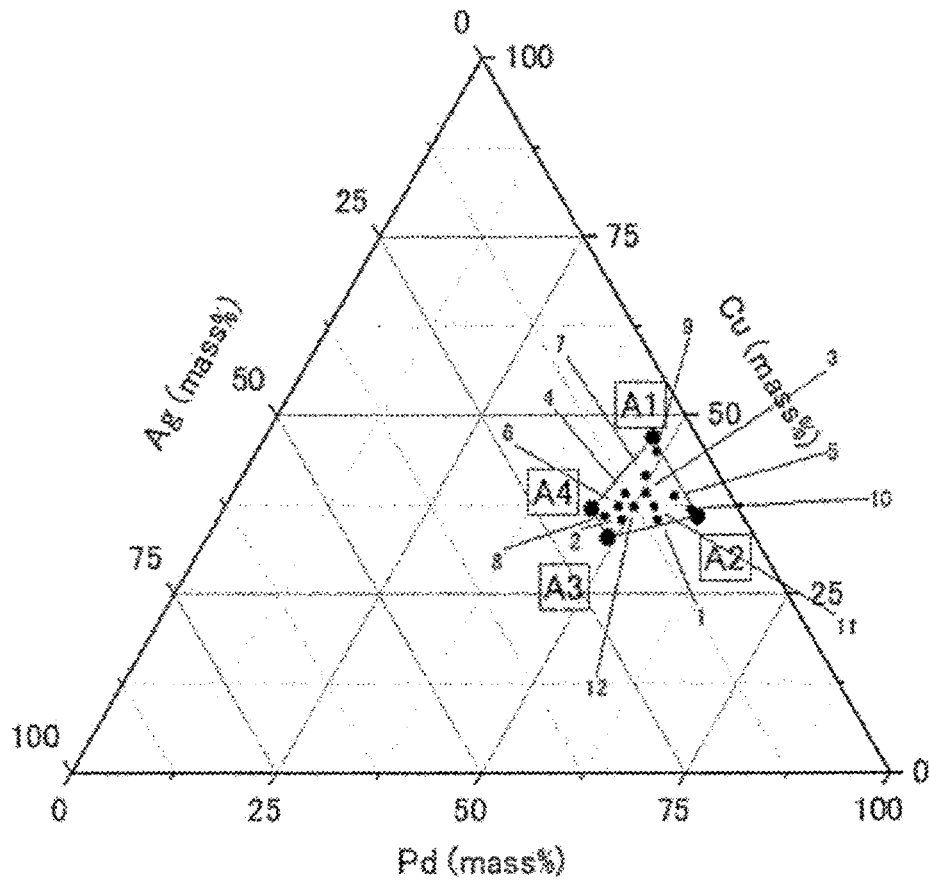
FIG. 4 shows a diagram illustrating a Ag—Pd—Cu ternary system phase diagram, and $S_{Ag}$, $S_{Pd}$ and $S_{Cu}$ as conversion values of the Ag concentration, the Pd concentration and the Cu concentration in each of Ag—Pd—Cu-based alloys in Examples 1 to 34 and Comparative Examples 5 to 12 examined in the present embodiment.
Figure 5:
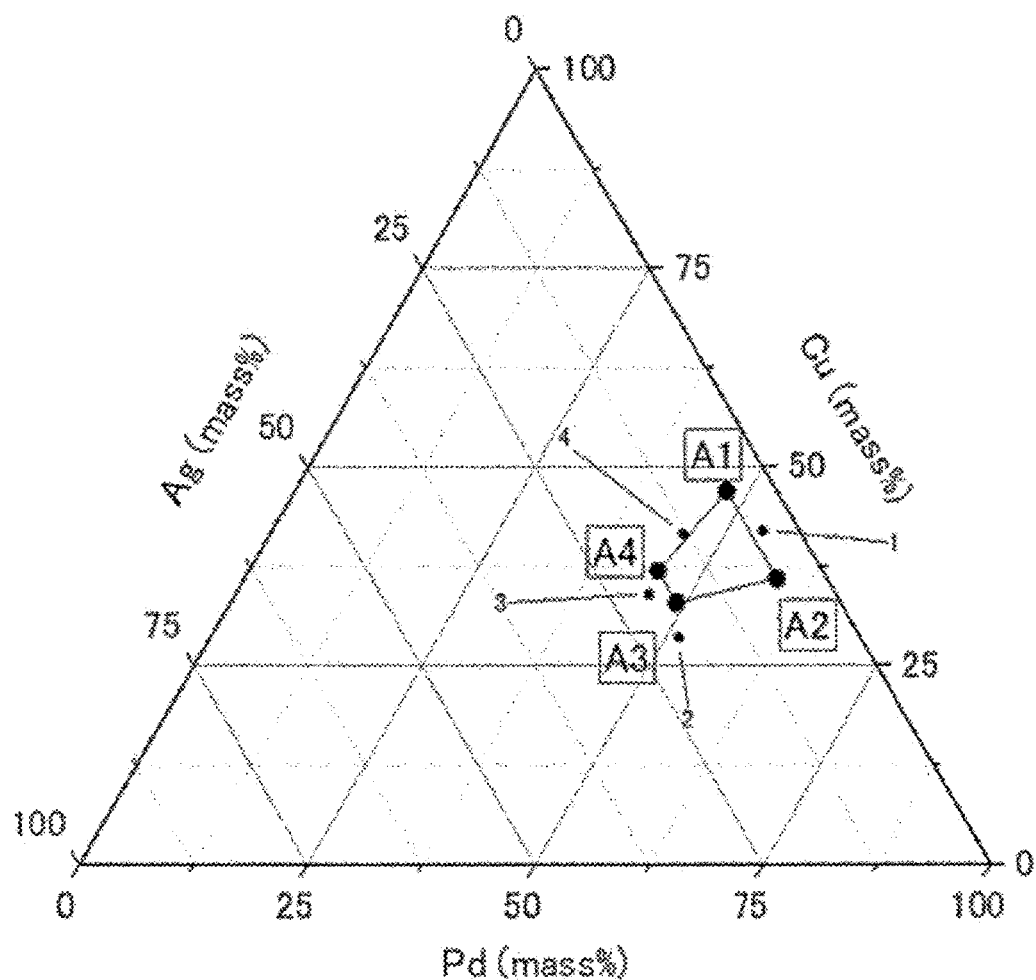
FIG. 5 shows a diagram illustrating a Ag—Pd—Cu ternary system phase diagram, and $S_{Ag}$, $S_{Pd}$ and $S_{Cu}$ as conversion values of the Ag concentration, the Pd concentration and the Cu concentration in each of Ag—Pd—Cu-based alloys in Comparative Examples 1 to 4 examined in the present embodiment.

The concentration of each constituent element in various alloy ingots produced was analyzed by ICP. The Ag concentration, the Pd concentration and the Cu concentration measured were converted into $S_{Ag}$, $S_{Pd}$ and $S_{Cu}$. The locations of the $S_{Ag}$, the $S_{Pd}$ and the $S_{Cu}$ in each of the Ag—Pd—Cu-based alloys produced in the present embodiment, in a Ag—Pd—Cu ternary system phase diagram, are illustrated in FIG. 4 and FIG. 5.

Next, alloy ingots of Ag—Pd—Cu ternary alloys having various compositions and Ag—Pd—Cu-based alloys having various compositions were each worked into a 4-mm square rod material, with cold groove rolling, and further subjected to cold wire drawing, to provide a wire rod having a diameter of 2 mm. Such an alloy wire rod was subjected to the first solution treatment involving heating at 800° C. for 30 minutes and then water cooling. Next, such an alloy wire rod was worked into a wire rod having a diameter of 1 mm, with cold wire drawing, and the wire rod was subjected to the second solution treatment involving heating at 850° C. for 30 minutes and water cooling. The wire rod was worked into a fine line having a diameter of 0.1 mm, with cold wire drawing, and then subjected to an aging heat treatment. The aging heat treatment was made with heating at 300 to 580° C. for 60 minutes.

The respective fine lines produced of the Ag—Pd—Cu ternary alloys having various compositions and the Ag—Pd—Cu-based alloys having various compositions were each subjected to measurements of the hardness and the specific resistance. These measurements were performed with respect to both the respective fine lines before the aging heat treatment (after working) and after the aging treatment. The hardness measurement was performed with a Vickers hardness meter at a load of 200 gf for an indentation time of 10 seconds. The specific resistance measurement was performed with measurement of the electric resistance with an electric resistance meter, and the specific resistance was calculated from the cross-sectional area and the length of a sample.

Figure 6:
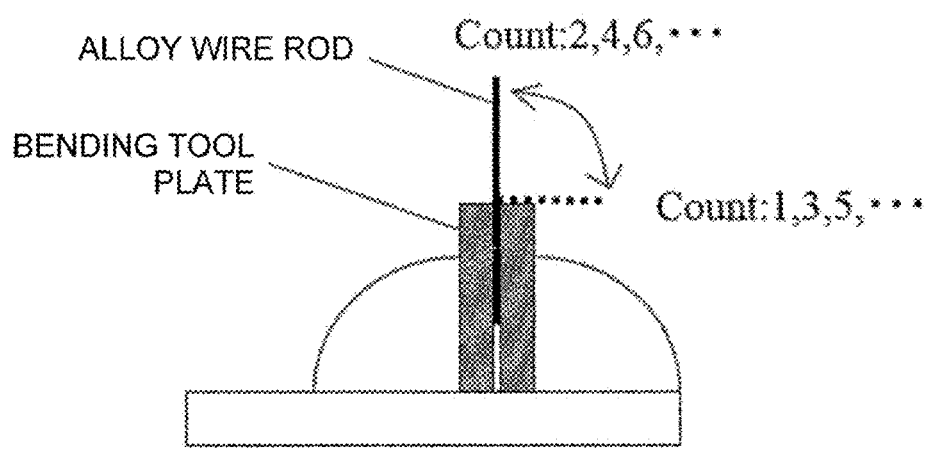
FIG. 6 shows an illustrative drawing of a method for evaluating bending resistance of a Ag—Pd—Cu-based alloy produced in the present embodiment.

An evaluation test of the bending resistance of each of the fine lines was performed. The evaluation test was performed by a method based on the above evaluation method. As illustrated in FIG. 6, an alloy fine line (diameter 0.1 mm), one end of which was secured with a jig, was bent at an angle of 90°, and bent so that the fine line returned from such a bent state to a straight line state. Such working operations for bending at 90° and returning were again repeated alternately, and the number of times of bending until breakage occurred was counted and evaluated. Such bending resistance evaluation was also performed with respect to the fine lines before and after the aging heat treatment.

Various measurement results about the respective fine lines of the Ag—Pd—Cu ternary alloys and the Ag—Pd—Cu-based alloys produced in the present embodiment are shown in Table 1.

TABLE 1

| | Alloy constitution | | | | | | | | | | Hardness (Hv) | | Specific resistance ($\mu\Omega \cdot cm$) | | Number of times of bending (times) | |
|---|---|---|---|---|---|---|---|---|---|---|---|---|---|---|---|---|
| | Composition (mass %) of AgPdCu-based alloy | | | | | | | AgPdCu ternary alloy conversion (mass %) | | | | | | | | |
| | Ag | Pd | Cu | B | Zn | Sn | Bi | $S_{Ag}$ | $S_{Pd}$ | $S_{Cu}$ | After working | After heat treatment | After working | After heat treatment | After working | After heat treatment |
| Example 1 | 10.60 | 53.50 | 35.25 | 0.15 | 0.5 | — | — | 10.67 | 53.85 | 35.48 | 304 | 458 | 25.22 | 6.69 | 10 | 15 |
| Example 2 | 14.95 | 49.17 | 35.23 | 0.15 | 0.5 | — | — | 5.05 | 49.49 | 35.46 | 308 | 465 | 26.47 | 7.81 | 11 | 13 |
| Example 3 | 10.17 | 50.20 | 38.98 | 0.15 | 0.5 | — | — | 10.24 | 50.53 | 39.23 | 302 | 512 | 25.97 | 6.48 | 13 | 12 |
| Example 4 | 12.72 | 47.68 | 38.95 | 0.15 | 0.5 | — | — | 12.80 | 47.99 | 39.21 | 298 | 499 | 27.49 | 8.00 | 12 | 12 |
| Example 5 | 6.99 | 53.89 | 38.52 | 0.1 | 0.5 | — | — | 7.03 | 54.21 | 38.76 | 298 | 538 | 26.78 | 6.10 | 9 | 5 |
| Example 6 | 6.96 | 53.67 | 38.37 | 0.5 | 0.5 | — | — | 7.03 | 54.21 | 38.76 | 320 | 556 | 27.41 | 6.84 | 9 | 7 |
| Example 7 | 6.89 | 53.15 | 37.96 | 1.5 | 0.5 | — | — | 7.03 | 54.21 | 38.76 | 337 | 560 | 27.65 | 7.62 | 9 | 7 |
| Example 8 | 7.01 | 54.07 | 38.67 | 0.15 | 0.1 | — | — | 7.03 | 54.21 | 38.76 | 290 | 458 | 26.58 | 6.13 | 12 | 13 |
| Example 9 | 6.98 | 53.86 | 38.51 | 0.15 | 0.5 | — | — | 7.03 | 54.21 | 38.76 | 295 | 551 | 27.17 | 6.21 | 13 | 13 |
| Example 10 | 6.95 | 53.59 | 38.31 | 0.15 | 1 | — | — | 7.03 | 54.21 | 38.76 | 314 | 581 | 29.42 | 7.08 | 8 | 5 |
| Example 11 | 7.01 | 54.07 | 38.67 | 0.15 | — | 0.1 | — | 7.03 | 54.21 | 38.76 | 285 | 451 | 28.44 | 6.21 | 13 | 13 |
| Example 12 | 6.98 | 53.86 | 38.51 | 0.15 | — | 0.5 | — | 7.03 | 54.21 | 38.76 | 298 | 538 | 28.13 | 6.37 | 12 | 13 |
| Example 13 | 6.95 | 53.59 | 38.31 | 0.15 | — | 1 | — | 7.03 | 54.21 | 38.76 | 324 | 573 | 29.25 | 7.09 | 8 | 6 |
| Example 14 | 7.01 | 54.07 | 38.66 | 0.15 | — | — | 0.1 | 7.03 | 54.21 | 38.76 | 284 | 447 | 27.64 | 6.09 | 12 | 12 |
| Example 15 | 6.98 | 53.86 | 38.51 | 0.15 | — | — | 0.5 | 7.03 | 54.21 | 38.76 | 295 | 514 | 28.90 | 6.19 | 13 | 12 |
| Example 16 | 6.95 | 53.59 | 38.31 | 0.15 | — | — | 1 | 7.03 | 54.21 | 38.76 | 326 | 570 | 28.97 | 7.14 | 8 | 7 |
| Example 17 | 14.48 | 47.81 | 37.06 | 0.15 | 0.5 | — | — | 14.57 | 48.12 | 37.31 | 290 | 472 | 26.83 | 7.98 | 10 | 13 |
| Example 18 | 9.02 | 48.95 | 41.38 | 0.15 | 0.5 | — | — | 9.08 | 49.27 | 41.65 | 288 | 501 | 26.59 | 7.45 | 13 | 13 |
| Example 19 | 16.86 | 46.82 | 35.67 | 0.15 | 0.5 | — | — | 16.97 | 47.12 | 35.91 | 315 | 398 | 27.09 | 8.28 | 11 | 12 |
| Example 20 | 5.96 | 48.68 | 44.71 | 0.15 | 0.5 | — | — | 6.00 | 49.00 | 45.00 | 285 | 380 | 25.40 | 7.58 | 13 | 13 |
| Example 21 | 5.76 | 56.83 | 36.76 | 0.15 | 0.5 | — | — | 5.80 | 57.20 | 37.00 | 312 | 478 | 25.98 | 6.28 | 12 | 11 |
| Example 22 | 10.07 | 52.18 | 37.10 | 0.15 | 0.5 | — | — | 10.14 | 52.52 | 37.34 | 317 | 384 | 26.23 | 6.04 | 11 | 12 |
| Example 23 | 12.59 | 49.70 | 37.11 | 0.1 | 0.5 | — | — | 12.67 | 50.00 | 37.33 | 312 | 418 | 26.14 | 7.04 | 11 | 6 |
| Example 24 | 12.54 | 49.50 | 36.96 | 0.5 | 0.5 | — | — | 12.67 | 50.00 | 37.33 | 379 | 456 | 28.99 | 7.55 | 9 | 11 |
| Example 25 | 12.42 | 49.02 | 36.56 | 1.5 | 0.5 | — | — | 12.67 | 50.00 | 37.33 | 388 | 509 | 30.24 | 8.00 | 8 | 11 |
| Example 26 | 12.64 | 49.88 | 37.23 | 0.15 | 0.1 | — | — | 12.67 | 50.00 | 37.33 | 320 | 442 | 25.32 | 7.68 | 10 | 11 |
| Example 27 | 12.59 | 49.68 | 37.08 | 0.15 | 0.5 | — | — | 12.67 | 50.00 | 37.33 | 324 | 442 | 26.50 | 7.38 | 12 | 12 |
| Example 28 | 12.53 | 49.43 | 36.89 | 0.15 | 1 | — | — | 12.67 | 50.00 | 37.33 | 330 | 484 | 26.94 | 7.94 | 8 | 6 |
| Example 29 | 12.64 | 49.88 | 37.23 | 0.15 | — | 0.1 | — | 12.67 | 50.00 | 37.33 | 314 | 445 | 27.14 | 7.70 | 9 | 8 |
| Example 30 | 12.59 | 49.68 | 37.08 | 0.15 | — | 0.5 | — | 12.67 | 50.00 | 37.33 | 319 | 453 | 27.48 | 7.85 | 9 | 8 |
| Example 31 | 12.53 | 49.43 | 36.89 | 0.15 | — | 1 | — | 12.67 | 50.00 | 37.33 | 348 | 497 | 27.55 | 7.86 | 9 | 5 |
| Example 32 | 12.64 | 49.88 | 37.23 | 0.15 | — | — | 0.1 | 12.67 | 50.00 | 37.33 | 308 | 429 | 27.08 | 7.61 | 14 | 11 |
| Example 33 | 12.59 | 49.68 | 37.08 | 0.15 | — | — | 0.5 | 12.67 | 50.00 | 37.33 | 324 | 438 | 27.16 | 7.74 | 11 | 10 |
| Example 34 | 12.53 | 49.43 | 36.89 | 0.15 | — | — | 1 | 12.67 | 50.00 | 37.33 | 336 | 484 | 26.16 | 7.89 | 10 | 5 |
| Comparative Example 1 | 3.97 | 53.65 | 41.73 | 0.15 | 0.5 | — | 1 | 4.00 | 54.00 | 42.00 | 285 | 422 | 25.77 | 10.08 | 14 | 8 |
| Comparative Example 2 | 19.87 | 51.10 | 28.38 | 0.15 | 0.5 | — | — | 20.00 | 51.43 | 28.57 | 299 | 317 | 27.61 | 26.73 | 11 | 11 |
| Comparative Example 3 | 20.37 | 45.21 | 33.77 | 0.15 | 0.5 | — | — | 20.50 | 45.50 | 34.00 | 313 | 486 | 29.10 | 11.40 | 9 | 3 |
| Comparative Example 4 | 12.89 | 45.12 | 41.34 | 0.15 | 0.5 | — | — | 12.97 | 45.41 | 41.62 | 326 | 484 | 19.79 | 9.01 | 11 | 4 |
| Comparative Example 5 | 7.03 | 54.21 | 38.76 | — | — | — | — | 7.03 | 54.21 | 38.76 | 273 | 289 | 29.10 | 5.06 | 10 | 10 |
| Comparative Example 6 | 7.02 | 54.16 | 38.72 | 0.1 | — | — | — | 7.03 | 54.21 | 38.76 | 313 | 364 | 26.43 | 5.78 | 11 | 6 |
| Comparative Example 7 | 7.00 | 53.94 | 38.56 | 0.5 | — | — | — | 7.03 | 54.21 | 38.76 | 324 | 368 | 26.81 | 6.84 | 9 | 8 |
| Comparative Example 8 | 6.93 | 53.41 | 38.16 | 1.5 | — | — | — | 7.03 | 54.21 | 38.76 | 322 | 375 | 27.14 | 7.52 | 9 | 8 |
| Comparative Example 9 | 12.36 | 48.78 | 36.36 | 2 | 0.5 | — | — | 12.67 | 50.00 | 37.33 | 273 | 474 | 29.10 | 8.30 | 10 | 0 |
| Comparative Example 10 | 12.48 | 49.26 | 36.76 | — | 1.5 | — | — | 12.67 | 50.00 | 37.33 | 279 | 477 | 29.70 | 7.85 | 13 | 0 |

TABLE 1-continued

| | Alloy constitution | | | | | | | | | | | | | |
|---|---|---|---|---|---|---|---|---|---|---|---|---|---|---|
| | Composition (mass %) of AgPdCu-based alloy | | | | | | | AgPdCu ternary alloy conversion (mass %) | | | Hardness (Hv) | | Specific resistance (μΩ·cm) | | Number of times of bending (times) | |
| | | | | | | | | | | | After working | After heat treatment | After working | After heat treatment | After working | After heat treatment |
| | Ag | Pd | Cu | B | Zn | Sn | Bi | $S_{Ag}$ | $S_{Pd}$ | $S_{Cu}$ | | | | | | |
| Comparative Example 11 | 12.48 | 49.26 | 36.76 | — | — | 1.5 | — | 12.67 | 50.00 | 37.33 | 284 | 469 | 29.30 | 8.50 | 15 | 0 |
| Comparative Example 12 | 12.48 | 49.26 | 36.76 | — | — | — | 1.5 | 12.67 | 50.00 | 37.33 | 383 | 475 | 26.71 | 8.01 | 12 | 1 |

Figure 1:
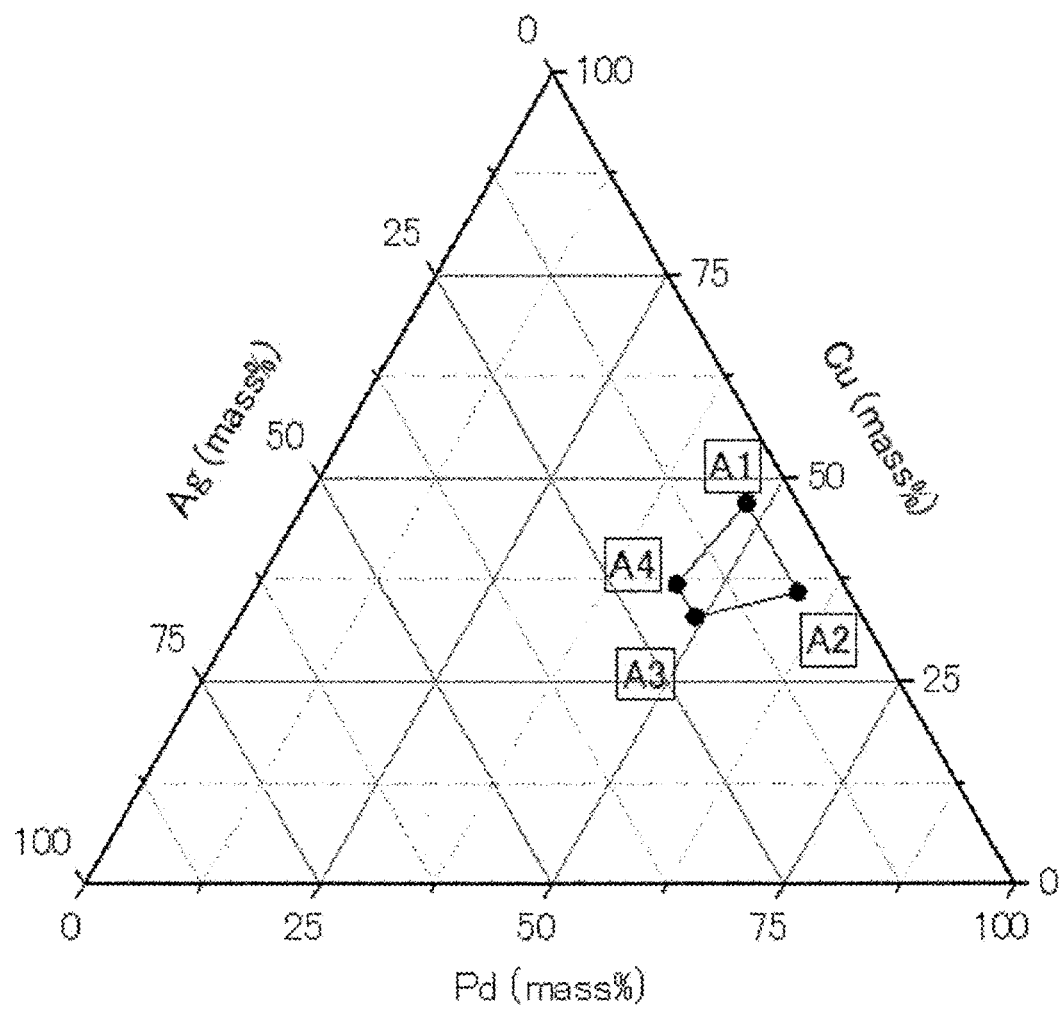
FIG. 1 shows a diagram illustrating a Ag—Pd—Cu ternary system phase diagram, and a range (A1-A2-A3-A4) of $S_{Ag}$, $S_{Pd}$ and $S_{Cu}$ as conversion values of the Ag concentration, the Pd concentration and the Cu concentration in the Ag—Pd—Cu-based alloy of the present invention.
Figure 2:
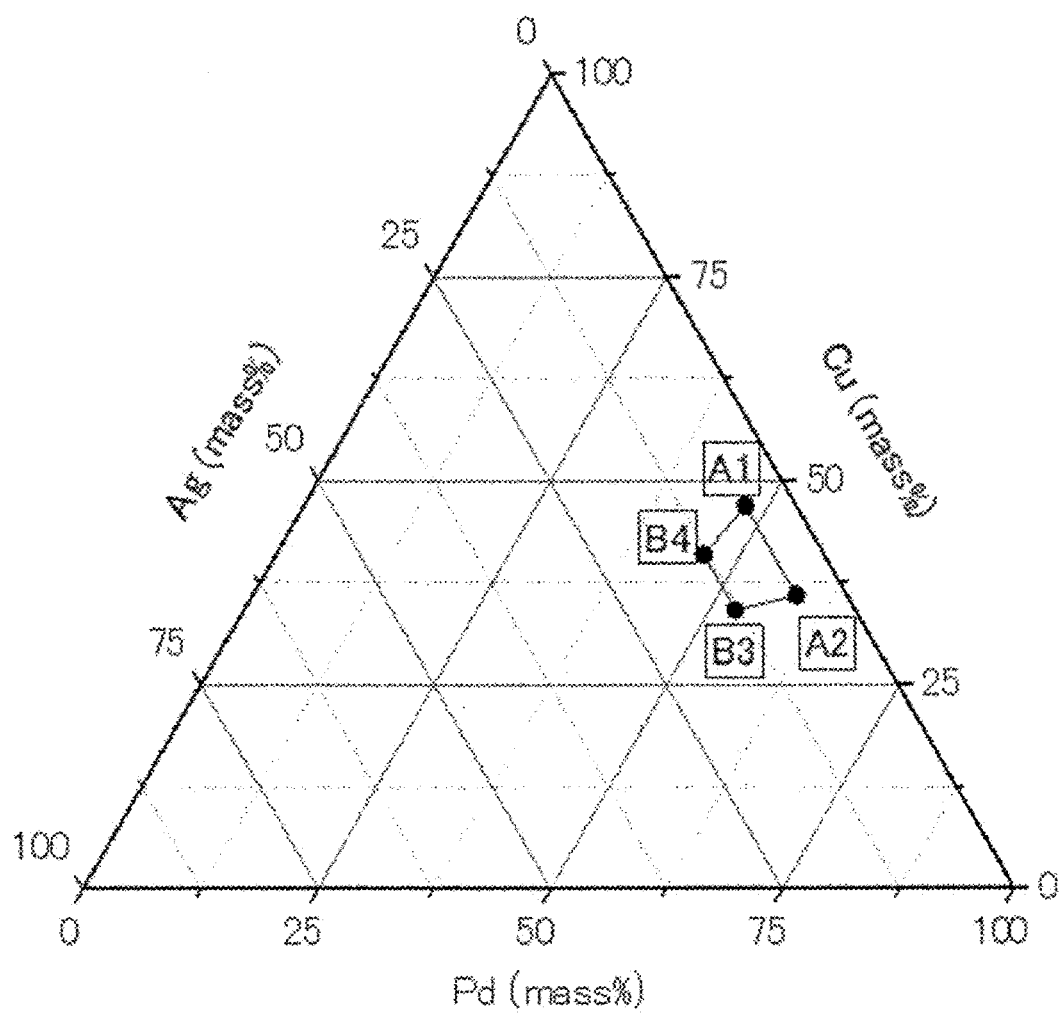
FIG. 2 shows a diagram illustrating a Ag—Pd—Cu ternary system phase diagram, and a preferable range (A1-A2-B3-B4) of $S_{Ag}$, $S_{Pd}$ and $S_{Cu}$ as conversion values of the Ag concentration, the Pd concentration and the Cu concentration in the Ag—Pd—Cu-based alloy of the present invention.
Figure 3:
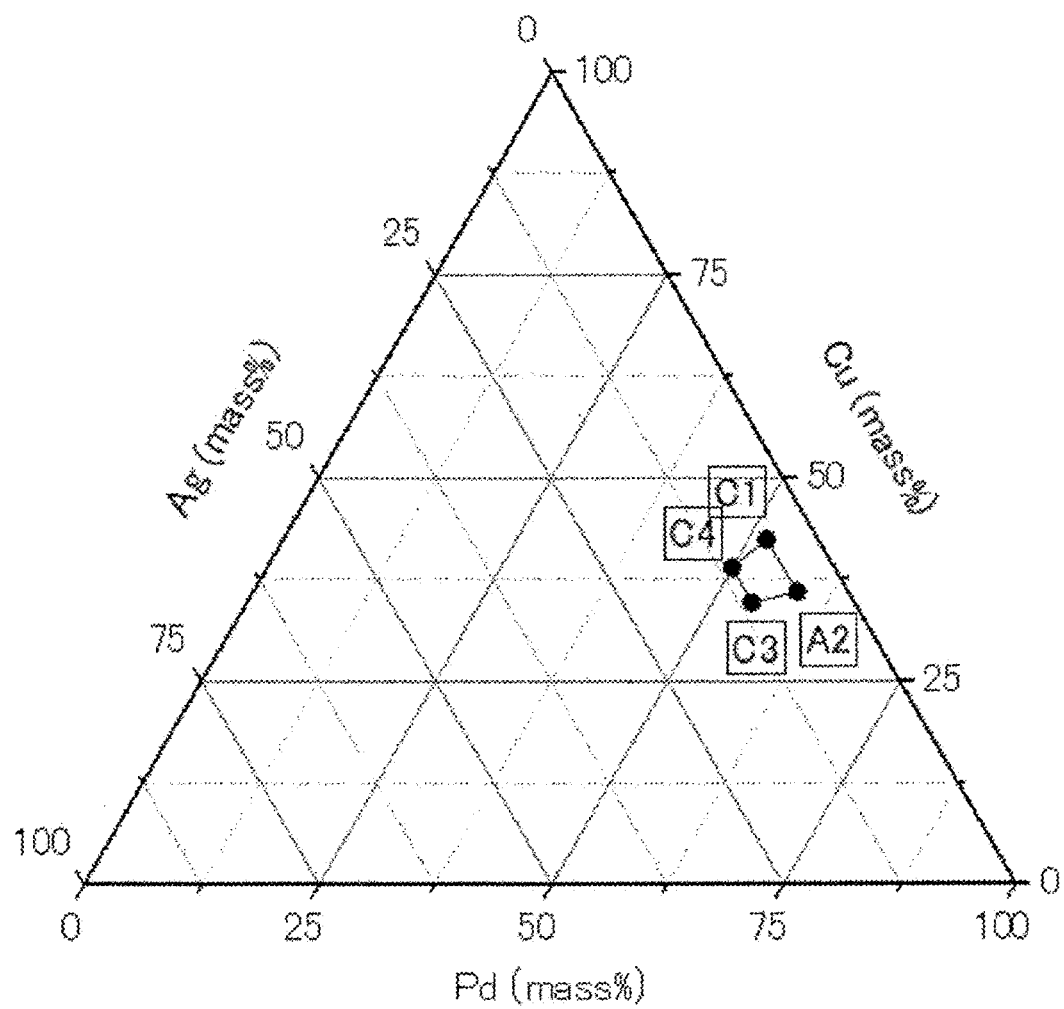
FIG. 3 shows a diagram illustrating a Ag—Pd—Cu ternary system phase diagram, and a more preferable range (C1-A2-C3-C4) of $S_{Ag}$, $S_{Pd}$ and $S_{Cu}$ as conversion values of the Ag concentration, the Pd concentration and the Cu concentration in the Ag—Pd—Cu-based alloy of the present invention.

It can be seen from Table 1 that optimization of the composition ranges of Ag, Pd and Cu and addition of appropriate additive elements are necessary for a reduction in resistance and improvements in hardness (wear resistance) and bending resistance, as objects of the present invention. In other words, a Ag—Pd—Cu-based alloy having concentrations of Ag, Pd and Cu so that $S_{Ag}$, $S_{Pd}$ and $S_{Cu}$ are outside a region of a polygon (A1-A2-A3-A4) in FIG. 1 is liable to be higher in specific resistance (Comparative Examples 1 to 4). Specifically, an alloy (Comparative Example 1) having a composition outside a line A1-A2, an alloy (Comparative Example 2) having a composition outside a line A2-A3, and an alloy (Comparative Example 3) having a composition outside a line A3-A4 each have a high specific resistance of more than 10 μΩ·cm after the aging heat treatment. The alloy in Comparative Example 2 is also inferior in hardness (less than 380 Hv), and the alloy in Comparative Example 3 is inferior in bending resistance (number of times of bending: 3). An alloy (Comparative Example 4) having a composition outside a line A4-A1 exhibits a specific resistance value of 10 μΩ·cm or less, but is liable to be higher in resistance. The alloy in Comparative Example 4 exhibits a number of times of bending of less than 5 (4) and is inferior in bending resistance. As described above, each of the alloys in Comparative Examples 1 to 4, although appropriately includes additive elements (B, and at least any of Zn, Bi and Sn) applied in the present invention, is inferior from the viewpoint of a reduction in resistance and is also sometimes insufficient in hardness and bending resistance.

Additive elements are required to be appropriately added to a Ag—Pd—Cu-based alloy. A Ag—Pd—Cu ternary alloy including no additive elements is considered to have the lowest hardness and be inferior in wear resistance (Comparative Example 5). Addition of B in an amount outside an appropriate range results in a poor effect of enhancing hardness (Comparative Examples 6 to 8). Furthermore, excess addition of B can lead to clear deterioration in bending resistance (Comparative Example 9). Furthermore, if the amounts of addition of Zn, Bi and Sn being additive elements each having an effect of enhancing hardness are outside proper ranges, the number of times of bending is less than 5 and bending resistance is deteriorated (Comparative Examples 10 to 12).

The Ag—Pd—Cu-based alloys (Examples 1 to 34), in which the concentrations of Ag, Pd and Cu are controlled so that $S_{Ag}$, $S_{Pd}$ and $S_{Cu}$ fall within a range of a polygon (A1-A2-A3-A4) in FIG. 1 and furthermore to which B and at least any of Zn, Bi and Sn are added, have each been confirmed to exhibit excellent characteristics of all low resistance (specific resistance), wear resistance (hardness) and bending resistance (number of times of bending), as compared with the Ag—Pd—Cu-based alloys in Comparative Examples.

INDUSTRIAL APPLICABILITY

As described above, the probe pin material of the present invention is low in resistance and excellent in wear resistance, and is also good in bending resistance. The probe pin material of the present invention is applied to a probe pin of a probe card for inspection in various electronic equipment, semiconductor devices, power devices, and the like. In particular, the probe pin material of the present invention, which is excellent in bending resistance, can also be usefully applied to a cantilever type probe pin, and a probe pin having a pogo pin shape.

What is claimed is:
1. A probe pin material comprising a Ag—Pd—Cu-based alloy comprising: Ag, Pd and Cu; B as a first additive element; at least any element of Zn, Bi and Sn as a second additive element, and unavoidable impurities,
    wherein the alloy contains no In; wherein $S_{Ag}$ is a ratio of a concentration of Ag in the alloy to a combined concentration of Ag, Pd and Cu in the alloy as mass %, $S_{Pd}$ is a ratio of a concentration of Pd in the alloy to the combined concentration of Ag, Pd and Cu in the alloy as mass %, $S_{Cu}$ is a ratio of a concentration of Cu in the alloy to the combined concentration of Ag, Pd and Cu in the alloy as mass %,
    wherein all values of the $S_{Ag}$, the $S_{Pd}$ and the $S_{Cu}$ fall within a range of a polygon (A1-A2-A3-A4) surrounded with straight lines connecting respective points of a point A1 (Ag: 5.5 mass %, Pd:47.5 mass %, Cu:47 mass %), a point A2 (Ag: 5.5 mass %, Pd:58.5 mass %, Cu:36 mass %), a point A3 (Ag: 18 mass %, Pd:49 mass %, Cu:33 mass %) and a point A4 (Ag: 18 mass %, Pd:45 mass %, Cu:37 mass %) in a Ag—Pd—Cu ternary system phase diagram,
    a concentration of the first additive element is 0.1 mass % or more and 1.5 mass % or less, and
    a concentration of the second additive element is 0.1 mass % or more and 1.0 mass % or less.
2. The probe pin material according to claim 1, wherein when one end of a wire rod comprising the Ag—Pd—Cu-based alloy is secured: and
    a first bending step of bending the wire rod at an angle of substantially 90° from a straight line state and a second bending step of bending the wire rod so as to return the wire rod from a bent state to the straight line state are alternately repeated, the first bending step and the second bending step being each defined as a single time of bending, and the number of times of bending until the wire rod is broken is counted, the number of times of bending counted is five or more.

3. A probe pin comprising the probe pin material defined in claim 1.

4. The probe pin material according to claim 1, wherein a Vickers hardness is 380 Hv or more and 580 Hv or less.

5. The probe pin material according to claim 4, wherein when one end of a wire rod comprising the Ag—Pd—Cu-based alloy is secured: and
a first bending step of bending the wire rod at an angle of substantially 90° from a straight line state and a second bending step of bending the wire rod so as to return the wire rod from a bent state to the straight line state are alternately repeated, the first bending step and the second bending step being each defined as a single time of bending, and the number of times of bending until the wire rod is broken is counted, the number of times of bending counted is five or more.

6. The probe pin material according to claim 1, wherein all values of the $S_{Ag}$, the $S_{Pd}$ and the $S_{Cu}$ fall within a range of a polygon (A1-A2-B3-B4) surrounded with straight lines connecting respective points of the point A1, the point A2, a point B3 (Ag: 13 mass %, Pd:52.8 mass %, Cu:34.2 mass %) and a point B4 (Ag: 13 mass %, Pd:46 mass %, Cu:41 mass %).

7. The probe pin material according to claim 6, wherein when one end of a wire rod comprising the Ag—Pd—Cu-based alloy is secured: and
a first bending step of bending the wire rod at an angle of substantially 90° from a straight line state and a second bending step of bending the wire rod so as to return the wire rod from a bent state to the straight line state are alternately repeated, the first bending step and the second bending step being each defined as a single time of bending, and the number of times of bending until the wire rod is broken is counted, the number of times of bending counted is five or more.

8. The probe pin material according to claim 6, wherein all values of the $Sa_{Ag}$, the $S_{Pd}$, and the $S_{Cu}$ fall within a range of a polygon (C1-A2-C3-C4) surrounded with straight lines connecting respective points of a point C1 (Ag: 5.5 mass %, Pd:52 mass %, Cu:42.5 mass %), the point A2, a point C3 (Ag: 11 mass %, Pd:54.3 mass %, Cu:34.7 mass %) and a point C4 (Ag: 11 mass %, Pd:50 mass %, Cu:39 mass %).

9. The probe pin material according to claim 6, wherein a specific resistance after an aging heat treatment is 10 μΩ·cm or less.

10. The probe pin material according to claim 6, wherein a Vickers hardness is 380 Hv or more and 580 Hv or less.

11. A probe pin comprising the probe pin material defined in claim 6.

12. The probe pin material according to claim 1, wherein all values of the $S_{Ag}$, the $S_{Pd}$, and the $S_{Cu}$ fall within a range of a polygon (C1-A2-C3-C4) surrounded with straight lines connecting respective points of a point C1 (Ag: 5.5 mass %, Pd:52 mass %, Cu:42.5 mass %), the point A2, a point C3 (Ag: 11 mass %, Pd:54.3 mass %, Cu:34.7 mass %) and a point C4 (Ag: 11 mass %, Pd:50 mass %, Cu:39 mass %).

13. The probe pin material according to claim 12, wherein a specific resistance after an aging heat treatment is 10 μΩ·cm or less.

14. The probe pin material according to claim 12, wherein a Vickers hardness is 380 Hv or more and 580 Hv or less.

15. The probe pin material according to claim 12, wherein when one end of a wire rod comprising the Ag—Pd—Cu-based alloy is secured: and
a first bending step of bending the wire rod at an angle of substantially 90° from a straight line state and a second bending step of bending the wire rod so as to return the wire rod from a bent state to the straight line state are alternately repeated, the first bending step and the second bending step being each defined as a single time of bending, and the number of times of bending until the wire rod is broken is counted, the number of times of bending counted is five or more.

16. A probe pin comprising the probe pin material defined in claim 12.

17. The probe pin material according to claim 1, wherein a specific resistance after an aging heat treatment is 10 μΩ·cm or less.

18. The probe pin material according to claim 17, wherein a Vickers hardness is 380 Hv or more and 580 Hv or less.

19. The probe pin material according to claim 17, wherein when one end of a wire rod comprising the Ag—Pd—Cu-based alloy is secured: and
a first bending step of bending the wire rod at an angle of substantially 90° from a straight line state and a second bending step of bending the wire rod so as to return the wire rod from a bent state to the straight line state are alternately repeated, the first bending step and the second bending step being each defined as a single time of bending, and the number of times of bending until the wire rod is broken is counted, the number of times of bending counted is five or more.

\* \* \* \* \*